United States Patent
Sinha et al.

(10) Patent No.: US 8,141,025 B2
(45) Date of Patent: Mar. 20, 2012

(54) METHOD OF PERFORMING TIMING ANALYSIS ON INTEGRATED CIRCUIT CHIPS WITH CONSIDERATION OF PROCESS VARIATIONS

(75) Inventors: Debjit Sinha, Wappingers Falls, NY (US); Eric A. Foreman, Fairfax, VT (US); Peter A. Habitz, Hinesburg, VT (US); Natesan Venkateswaran, Hopewell Junction, NY (US); Chandramouli Visweswariah, Croton-on-Hudson, NY (US); Vladimir Zolotov, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 499 days.

(21) Appl. No.: 12/354,306

(22) Filed: Jan. 15, 2009

(65) Prior Publication Data

US 2010/0180243 A1    Jul. 15, 2010

(51) Int. Cl.
*G06F 17/50* (2006.01)
*G06F 9/455* (2006.01)

(52) U.S. Cl. ......... 716/134; 716/108; 716/113; 716/132

(58) Field of Classification Search .................. 716/108, 716/113, 132, 134
See application file for complete search history.

(56) References Cited

U.S. PATENT DOCUMENTS

| | | | |
|---|---|---|---|
| 7,111,260 B2 | 9/2006 | Visweswariah | |
| 7,437,697 B2* | 10/2008 | Venkateswaran et al. | 716/113 |
| 7,861,199 B2* | 12/2010 | Visweswariah et al. | 716/113 |

* cited by examiner

*Primary Examiner* — Nghia Doan
(74) *Attorney, Agent, or Firm* — H. Daniel Schnurmann (57) ABSTRACT

A method for verifying whether a circuit meets timing constraints by performing an incremental static timing analysis in which slack is represented by a distribution that includes sensitivities to various process variables. The slack at an endpoint is computed by propagating the arrival times and required arrival times of paths leading up to the endpoint. The computation of arrival and required arrival times needs the computation of delays of individual gate and wire segments in each path that leads to the endpoint. The mixed mode adds a deterministic timing to the statistical timing (DSTA+SSTA).

17 Claims, 7 Drawing Sheets

METHOD OF PERFORMING TIMING ANALYSIS ON INTEGRATED CIRCUIT CHIPS WITH CONSIDERATION OF PROCESS VARIATIONS

FIELD OF THE INVENTION

The invention generally relates to the field of Design Automation of integrated circuit (IC) chips, and more particularly, to a statistical static timing analysis (SSTA) performed on the IC chip.

RELATED PRIOR ART

The significance of variability in modern IC chip designs and manufacturing processes is critical and cannot be ignored. In addition, environmental variations (e.g., variations of the supply voltage and temperature) contribute to uncertainties in the timing characteristics of a design.

Statistical static timing analysis (SSTA) has emerged as a solution to address these issues and considers the impact of variations to circuit analysis and optimization. Similar to deterministic static timing analysis (DSTA), SSTA models a circuit by way of a timing graph $G(N,E,P_I,P_O)$, where N is a set of nodes; E, a set of edges; $P_I$, a set of primary inputs; and $P_O$, a set of primary outputs. The nodes of the timing graph correspond to inputs and outputs of the digital cells (gates) and circuit inputs and outputs. The edges of the timing graph (timing edges or timing arcs) model the signal propagation from their source nodes to their sink nodes. Each timing edge is assigned a delay required for propagating a signal from the source node of the edge to its sink node. The primary inputs of the timing graph correspond to the circuit inputs. Each primary input node is assigned a signal arrival time (AT) defined as the time when an input signal appears at the circuit input. Similarly, the primary outputs of the timing graph correspond to the circuit outputs. Each primary output is assigned a required arrival time (RAT), i.e., the latest signal arrival (for late mode circuit operation) time required for a correct circuit operation.

Figure 1:
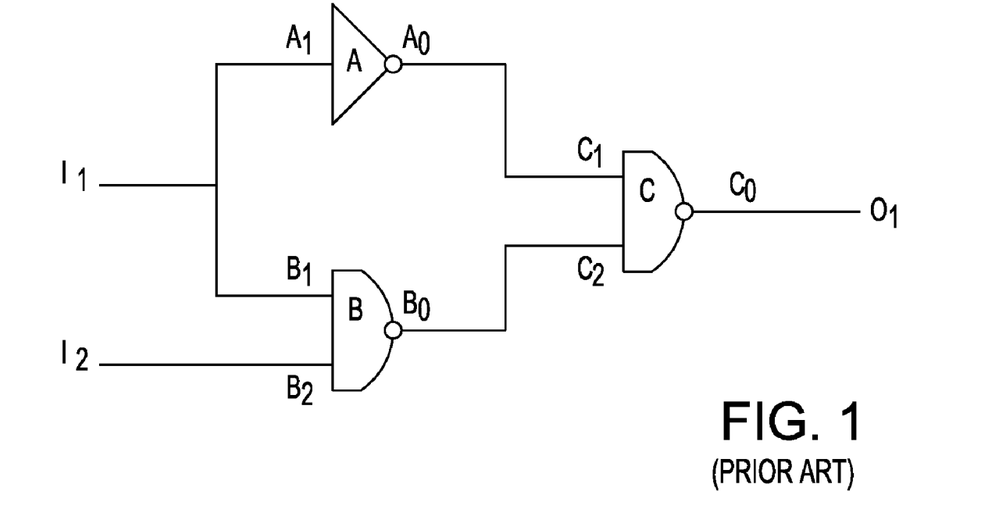
FIG. 1 is a diagram showing a prior art block diagram of a digital circuit.
Figure 2:
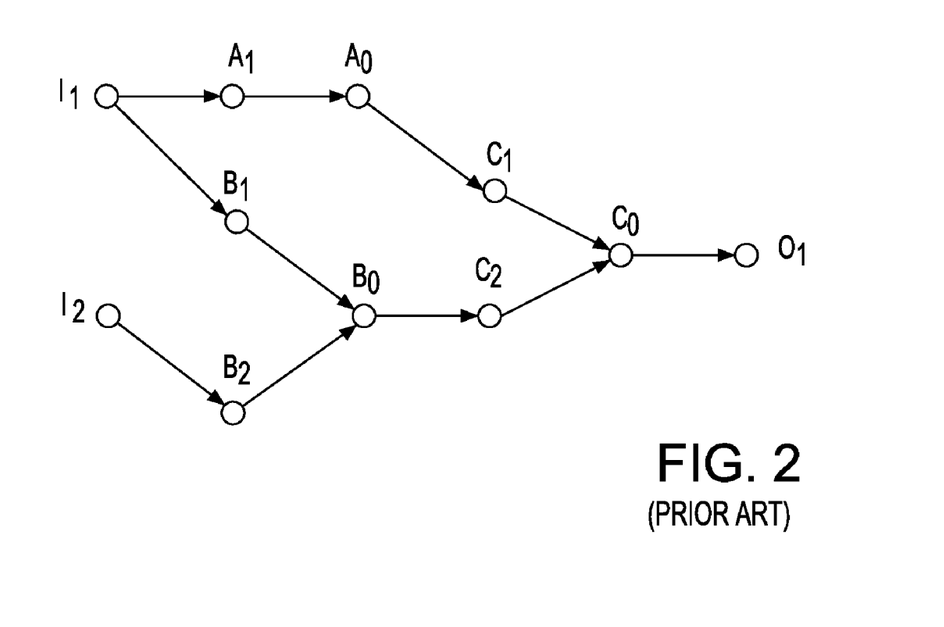
FIG. 2 shows a diagram depicting a timing graph modeling the digital circuit shown in FIG. 1.

Referring to FIG. 1, there is shown an illustrative example of a digital circuit having three digital cells (A, B, C) provided with two primary inputs ($I_1$, $I_2$) and one primary output $O_1$. Inputs of the gates are respectively labeled $A_1$, $B_1$, $B_2$, $C_1$, $C_2$, while the outputs of the gates are labeled $A_O$, $B_O$, and $C_O$. FIG. 2 shows the corresponding timing graph that models the digital circuit of FIG. 1. The nodes of the graph are $\{A_1, B_1, B_2, C_1, C_2, A_O, B_O, C_O\}$ and the primary inputs and output of the graph are respectively labeled ($I_1$, $I_2$) and $O_1$.

Both the deterministic and statistical static timing analyses compute the worst signal arrival and required arrival times at nodes of a timing graph. AT signals propagate forward from the primary inputs to the primary output through timing edges by adding their delays to the signal ATs. The worst AT at a given node is calculated as the maximum of all ATs of the timing edges incoming to the node. RAT signals are propagated backward from the primary outputs to the primary inputs and the edge delays are subtracted from the signal RATS. At each node, the worst RAT is calculated as the minimum of all the RATs of its corresponding outgoing edges. Timing slack at a node is computed as the difference between signal RAT and AT. A slack is determined as a measure of how early the signal arrives at the node with respect to its required arrival time. Positive timing slack indicates that the circuit operates correctly, while a negative timing slack is indicative of a timing failure.

The deterministic timing analysis calculates all the timing parameters as single deterministic numbers corresponding to a particular combination of process and environmental parameters. Therefore, it cannot model process and environmental variations affecting the delays of circuit cells and, consequently, ATs, RATs and timing slacks.

The SSTA is targeted for predicting statistical distributions of the circuit timing characteristics and their dependence on process and environmental parameters. Therefore, SSTA models all the timing parameters (delays, signal slews (transition times), ATs, RATs, timing slacks and the like) as functions of variational parameters. Typically, timing parameters are modeled in a linear canonical form provided by the equation $$T = t_0 + \sum_{i=1}^{n} t_i \Delta X_i + t_r \Delta R_T \qquad (EQ1)$$

where $t_0$ is the mean value of timing T; $t_i$ is the sensitivity of T to a variation $\Delta X_i$ of global parameter $X_i$; and $t_r$ is the sensitivity of T to an uncorrelated variation $\Delta R_T$. It is assumed that the global parameters $X_i$ are the same for the delays of all digital cells and interconnects of the circuit, while uncorrelated variations $\Delta R_T$ are statistically independent for different digital cells and interconnect wires.

Figure 3:
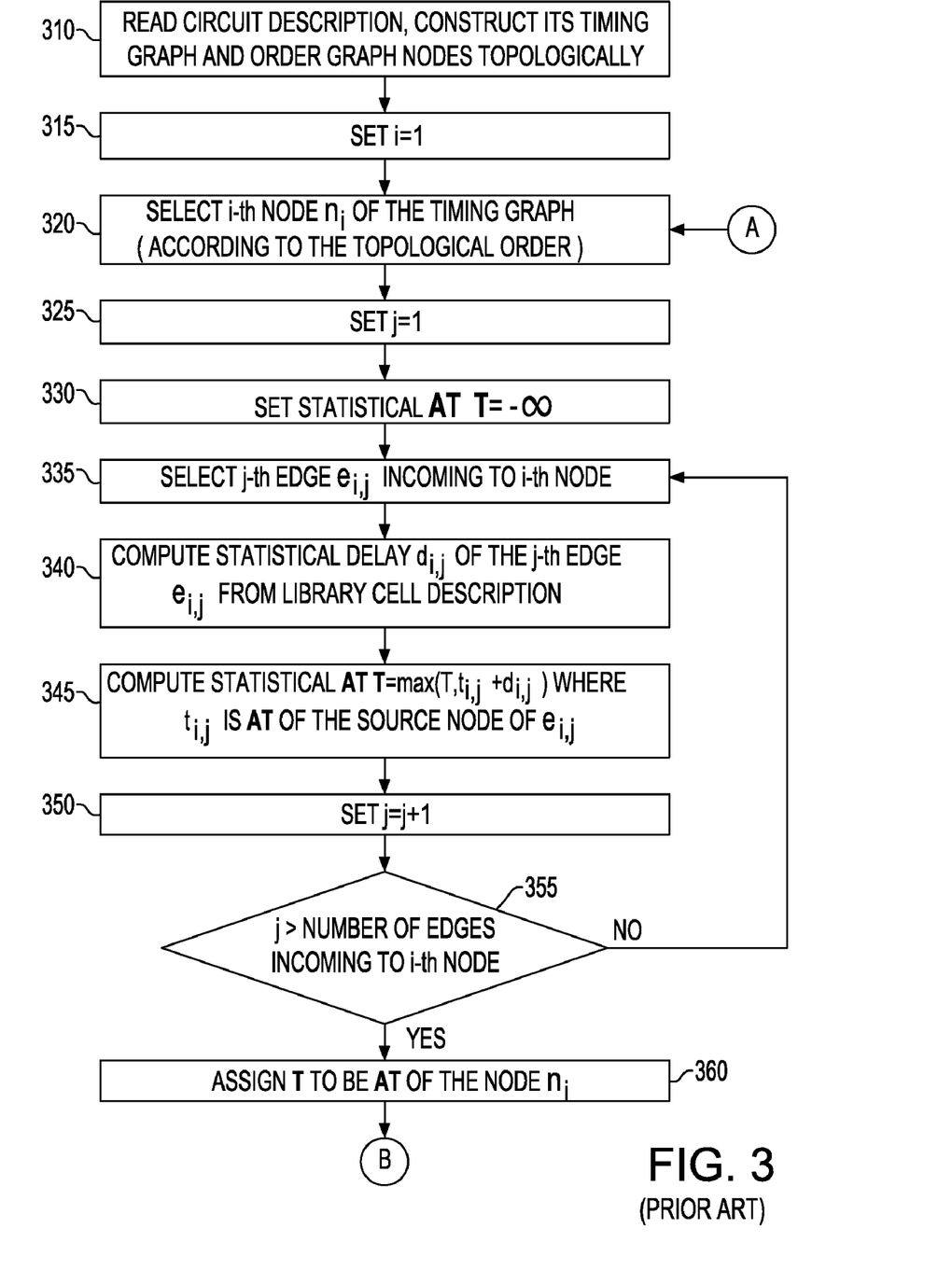
FIGS. 3 and 4 are flow charts illustrating a flow chart of a conventional algorithm applicable to a statistical timing analysis.
Figure 4:
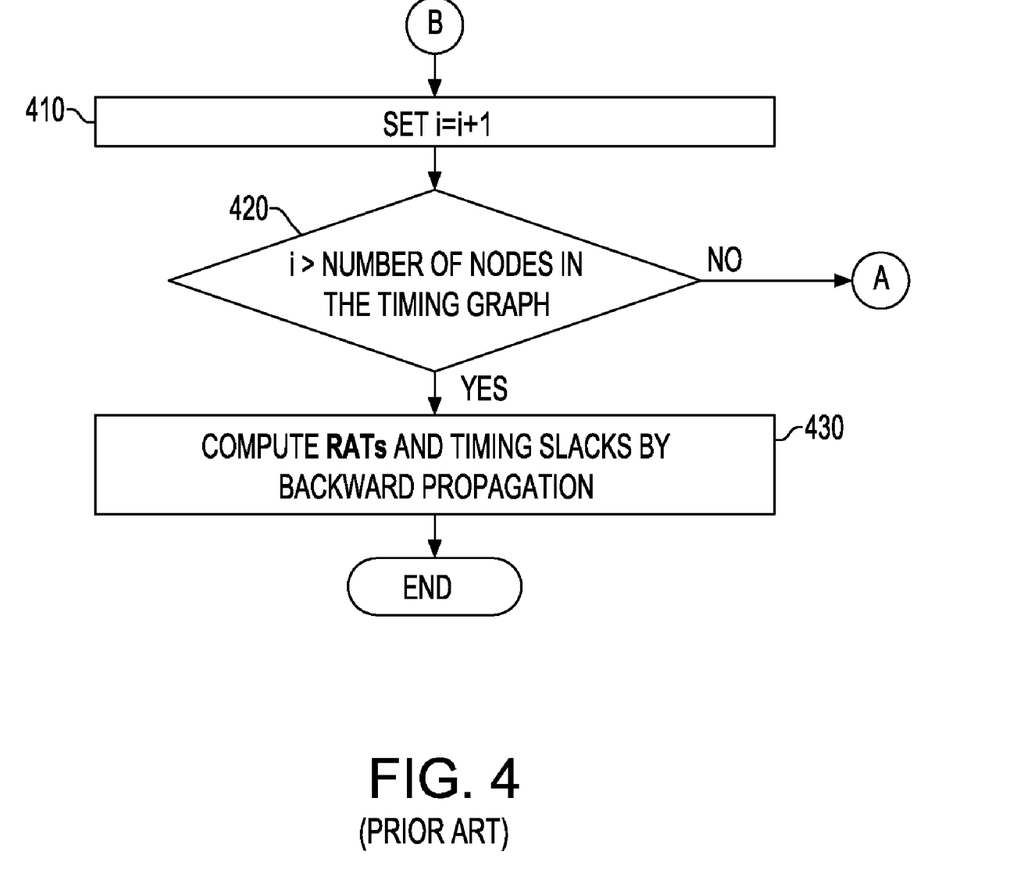

FIGS. 3 and 4 are flow charts of a conventional statistical timing analysis algorithm.

Referring to Block 310, a circuit description is read and its timing graph is constructed. Circuit nodes are topologically ordered to ensure that by the time AT at a node is to be calculated, the ATs at the sources of the edges incoming to the node having already been computed.

Block 315 initializes the counter i of the timing graph node to prepare for their enumeration, Block 320 selects the $i^{th}$ node for calculating its arrival time (AT), and Block 325 initializes the counter j of timing edges incoming to the $i^{th}$ node.

Block 330 initializes a temporary variable for accumulating a maximum of all arrival times at sinks of the timing edges incoming to the $i^{th}$ node of the timing graph, while Block 335 selects the $j^{th}$ timing edge $e_{i,j}$ incoming to the $i^{th}$ node.

Block 340 computes the statistical delay $d_{i,j}$ of the selected edge $e_{i,j}$ preferably in the form given by equation (EQ 1), and it is usually achieved by computing delays of the corresponding digital cell or interconnect for several process corners (combinations of process and environmental parameters), followed by calculating the sensitivities to variational parameters by finite differencing.

Block 345 accumulates the statistical maximum of ATs at the sinks of incoming edges $e_{i,j}$ of variable T. AT $t_{i,j}$ at the source of the timing edge $e_{i,j}$ is incremented by edge delay $d_{i,j}$ combined with a statistical maximum operation corresponding to the previous value of variable T. Details of the statistical maximum operation are described in U.S. Pat. No. 7,111,260 to Venkateswaran, et al., of common assignee.

Block 350 increments the counter of the timing edges incoming to the $i^{th}$ node of the timing graph.

Block 355 checks whether all the edges incoming to the $i^{th}$ node have been considered. If all the edges have indeed been considered, the control is transferred to block 360. Otherwise, control is passed on to block 335.

Block 360 sets the arrival time at the $i^{th}$ node to be equal to the value computed in variable T.

Block 410 increments the counter of the nodes of the timing graph.

Block 420 checks whether all the nodes of the timing graph have been considered. If the answer is affirmative, control is transferred to block 430. Otherwise, it branches to block 320.

Block 430 computes RATs and timing slacks at the nodes of the timing graph by backward propagation. The backward propagation is performed in a manner similar to the forward propagation, but the nodes are enumerated in reverse topological order. During the backward propagation, RATs are computed using the edge delays calculated during the forward propagation and stored at the data structures describing the nodes of the timing graph. Storing these delays demands a significant amount of memory, although their re-computation requires excessive CPU time.

A significant cost when performing SSTA is the long run time caused by expensive statistical delay calculations. For each timing edge in the timing graph, SSTA computes the sensitivities of the delay (and signal slew) to the variational parameters (sources of variations). Various techniques for computing these sensitivities exist: analytical, numerical by finite differencing, adjoining circuit modeling, and the like, all of which are more expensive computationally than the deterministic delay computation used by the deterministic static timing. The cost is further increased by the fact that accurate statistical timing analyses require taking into account signal slews that are also expressed as functions of variational parameters. Thus, the CPU time requirements of SSTA are much higher than a traditional deterministic timing analysis.

Another significant cost is associated with the increased memory requirements. In each location of the timing model where DSTA stores a single timing parameter (AT, RAT, delay or signal slews), SSTA has to store a complete statistical description of the same timing parameter provided by EQ 1. The statistical description includes the sensitivities to multiple variational parameters and requires many times more memory than a single deterministic timing parameter. This creates significant difficulties when applying statistical timing to the modern chips comprising many millions of gates and interconnects.

In an SSTA, all the timing parameters are propagated as statistical distributions whereas traditional deterministic static timing analyses (DSTA) propagate a single valued deterministic data. The propagated timing parameters include arrival times, required arrival times, and slews, along with any other timing-related parameters (guard times, adjusts, asserts, and the like). A primary advantage of SSTA is that it provides coverage over the entire process space, while traditional DSTA only covers a single process corner (otherwise known as a PVT point).

It is known in the art that the memory growth typically necessitates techniques storing only selected data of the timing graph and recalculating missing data as required. Since there is no known prior art that addresses reducing the run time explosion of SSTA, there is a need in industry for a method that can significantly reduce the memory requirements in addition to curtailing the SSTA run time.

OBJECTS AND SUMMARY OF THE INVENTION

Accordingly, it is an object of the present invention to provide a method to evaluate the timing performance of an IC chip design by efficiently conducting statistical timing analysis of the digital circuits.

It is another object of the invention to provide a method that selectively avoids calculating and/or propagating statistical delays and slews while preserving the benefits of full process coverage provided by SSTA.

It is still another object to provide a method that circumvents the need to perform a statistical analysis of non-critical paths in the chip design.

It is yet another object to provide a method that efficiently uses slack from a corner based deterministic timing as an indicator of critical timing points or paths.

In one aspect of the invention, the timing analysis/evaluation verifies that the digital circuits forming an IC chip meet given timing constraints, usually measured by the worst path slack of paths leading to the various endpoints of the circuit. In the SSTA, slack is preferably represented by a distribution, which includes the sensitivities to the different process variables. The endpoint slack is computed by propagating the arrival times and required arrival times of paths leading to the endpoint. The computation of arrival and required arrival times necessitates the computation of delays of individual gate and wire segments in each path that leads to the endpoint.

In another aspect of the invention, since SSTA requires significant runtime and memory, the inventive method addresses both run time and memory growth by selectively avoiding calculating and/or propagating statistical delays and slews. The benefits of full process coverage provided by SSTA are fully preserved, resulting in a mixed mode deterministic plus statistical timing (DSTA+SSTA) as it applies to the computation of delays. However, without loss of generality, the method provided herein also applies to the slew calculation.

The flow for a selective SSTA+DSTA can be summarized as follows. A given circuit is initially analyzed using any traditional deterministic static timing analyzer at some chosen process corner, often required in a methodology flow for coupling analysis or PLL adjusts. Statistical timing is then enabled, and a filtering criterion for slacks is obtained as an input. Subsequently, for each timing arc in the design (in topological order) a deterministic slack is considered and a check is made to determine whether it satisfies the slack filtering criterion. If the criterion is not satisfied, a statistical delay modeling is performed for the edge to obtain statistical timing results at a sink of the edge. However, if the criterion is satisfied, the available deterministic delay is used as an approximation for the delay across the timing arc.

The invention advantageously avoids computing more expensive statistical delays when the DSTA slack is so positive that variability cannot make the slack negative, i.e., when variability is not the cause of a timing fail. For instance, if a timing point has a slack of +1 ns at some starting process corner (e.g., the starting corner in which DSTA was performed), then there is no path through the timing point having a slack worse than +1 ns at the starting process corner. If for a given technology, it is known that the variability cannot degrade the starting-corner slack by more than 1 ns, then the timing point is "safe," i.e., it cannot contribute to a fail at any end point anywhere in the process space. In this case, one can avoid the more compute intensive statistical delay computation of segments feeding the timing point. By avoiding the computation of delay sensitivities, CPU time and memory can be reduced. The main step is to compare DSTA slack to a "swing" which is the maximum change of slack that is expected due to variability.

The inventive method is further customized by using the concept of edge slack. Edge slack for an arc from node A to node B (in late mode) is defined as RAT_B -(AT_A+d_AB), wherein d_AB represents the delay of the arc. Edge slack provides the worst slack among all paths through a particular edge, and DSTA can be compared to a threshold on a per-arc basis to decide if statistical modeling can be skipped.

The present invention provides a method for statistically analyzing the timing performance of an integrated circuit (IC) chip design given a predetermined edge slack filtering criterion, the method including: a) performing a deterministic static timing analysis of the IC chip design to obtain deterministic values of timing parameters of the IC chip design; b) computing a deterministic edge slack for each timing edge of the IC chip design from the deterministic values of the timing parameters; c) approximating the deterministic value of at least one timing parameter to its statistical representation, if the deterministic edge slack meets the filtering criterion; else, computing an actual statistical representation of the at least one timing parameter; and e) conducting the statistical analysis of the timing performance of the IC chip design by propagating mixed-mode deterministic and statistical timing parameters throughout the IC chip design.

A significant cost of performing SSTA is attributed to the long run time due to expensive statistical delay modeling. For each arc in the timing graph, SSTA techniques compute first order sensitivities of delay to various sources of variation. To obtain the sensitivity to a given source of variation X, SSTA computes parameter delta_delay/delta_sigma, where delta_delay is the difference in delays obtained by setting parameter X to two different process points P1 and P2 in the process space and delta_sigma is a measure of the normalized deviation of parameter X between process points P1 and P2. SSTA computes sensitivities to each source of variation for each timing arc, as previously stated. A similar technique is employed to compute the slew (transition time) sensitivities. Thus, the CPU time requirements of SSTA techniques are much larger than that of a traditional single corner DSTA technique.

Moreover, in view of the significant cost associated with the increase in memory requirements, the inventive method provides for each location where DSTA stores a single timing value (e.g., an arrival time), SSTA must also store a complete statistical description of the same timing parameter. The statistical description can include N+3 or more terms, where N is the number of sources of variation (some value typically are greater than 10, and increasing with technology node), added to a distribution mean, added to an independently random term, and added to a term for systematic variation. The number then increases significantly when, for example, spatial variation is taken into account. Therefore, the memory required to store a single timing parameter in SSTA is often 10 times or more compared to the memory required in DSTA. The poses a significant obstacle as traditional DSTA was already pushing the limits of typically available memory for large designs.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, where:

DETAILED DESCRIPTION

The present invention and various features, aspects and advantages details are explained more fully with reference to the non-limiting embodiments that are illustrated in the accompanying drawings and detailed in the following description.

A first embodiment of the present invention that addresses both the runtime and memory growth will now be described. As previously stated, SSTA necessitates significant run time and memory requirements. The present embodiment shows the benefits of full process-coverage provided by SSTA while selectively avoiding calculating and propagating statistical delays and slews. A mixed mode static timing analysis is combined with deterministic and statistical approaches. In what follows, for simplicity, the computation of delays of timing edges will be used. However, without loss of generality, the technique can also be directly applied to signal slew calculations.

A primary purpose of timing analysis is to verify that the circuit meets timing constraints, i.e., lacking negative timing slacks. Usually, it is important to have high accuracy in the computation of timing slacks close to 0. For a large positive or negative timing slack, it is sufficient to know that it is significantly positive or negative, its actual accurate value not being very important.

In one embodiment, the present invention avoids having to calculate and store complex models of delays, slews, ATs and RATs for edges or nodes of the timing graphs that are not critical for timing analysis. Thus, if one predicts that a timing edge is responsible for propagating a signal with very large negative or very large positive timing slack, the inventive method avoids expensive computations of statistical delays and slews of the signal propagating through the edge. Instead, the delays and slews can be approximated by their deterministic values. Later, for a statistical timing analysis, the deterministic values can be formally converted to a linear canonical form, i.e., EQ1, assuming zero sensitivities to process variations.

Figure 5:
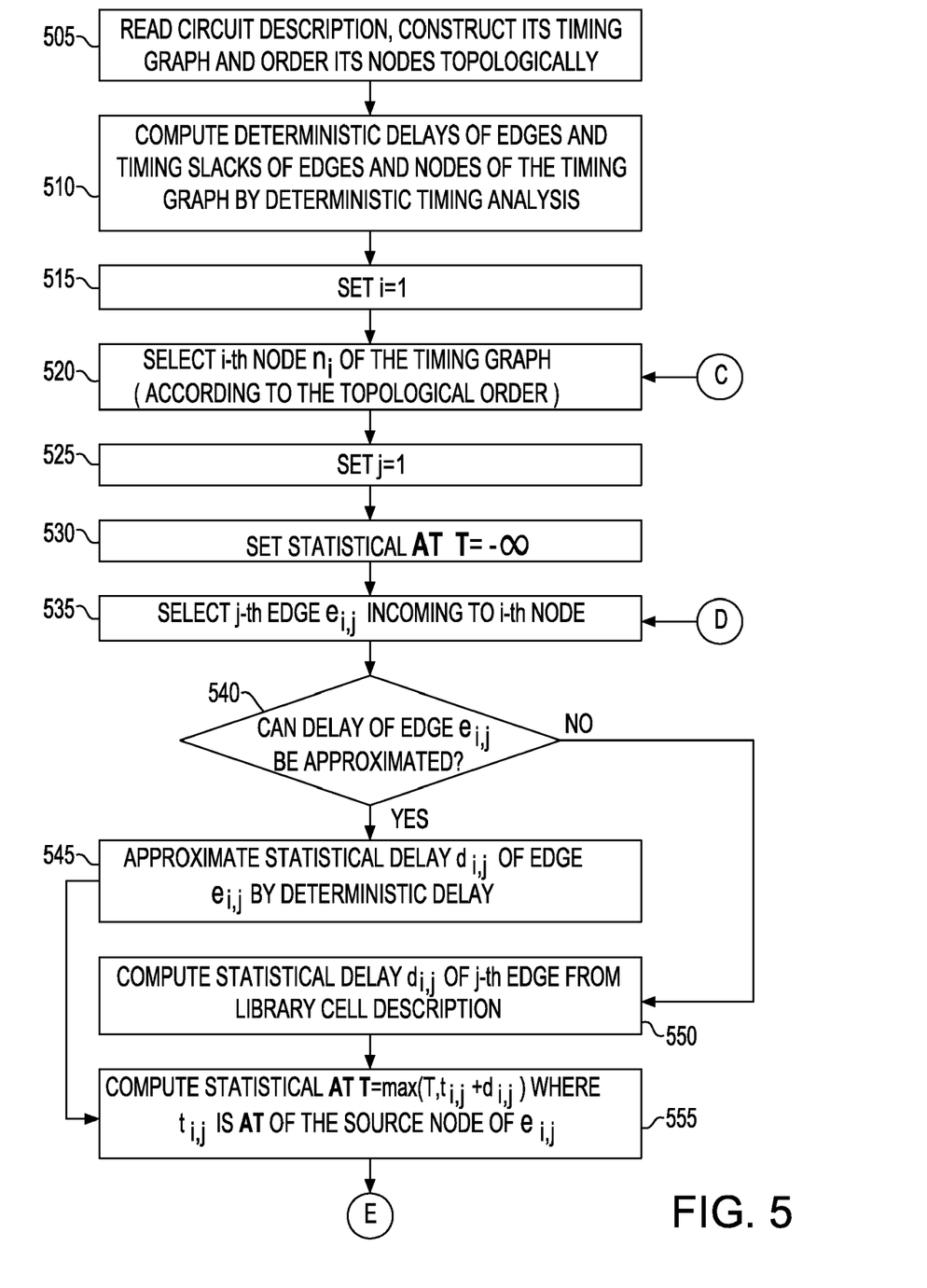
FIGS. 5 and 6 are flow charts illustrating of the mixed mode statistical timing analysis according to a preferred embodiment of the present invention.
Figure 6:
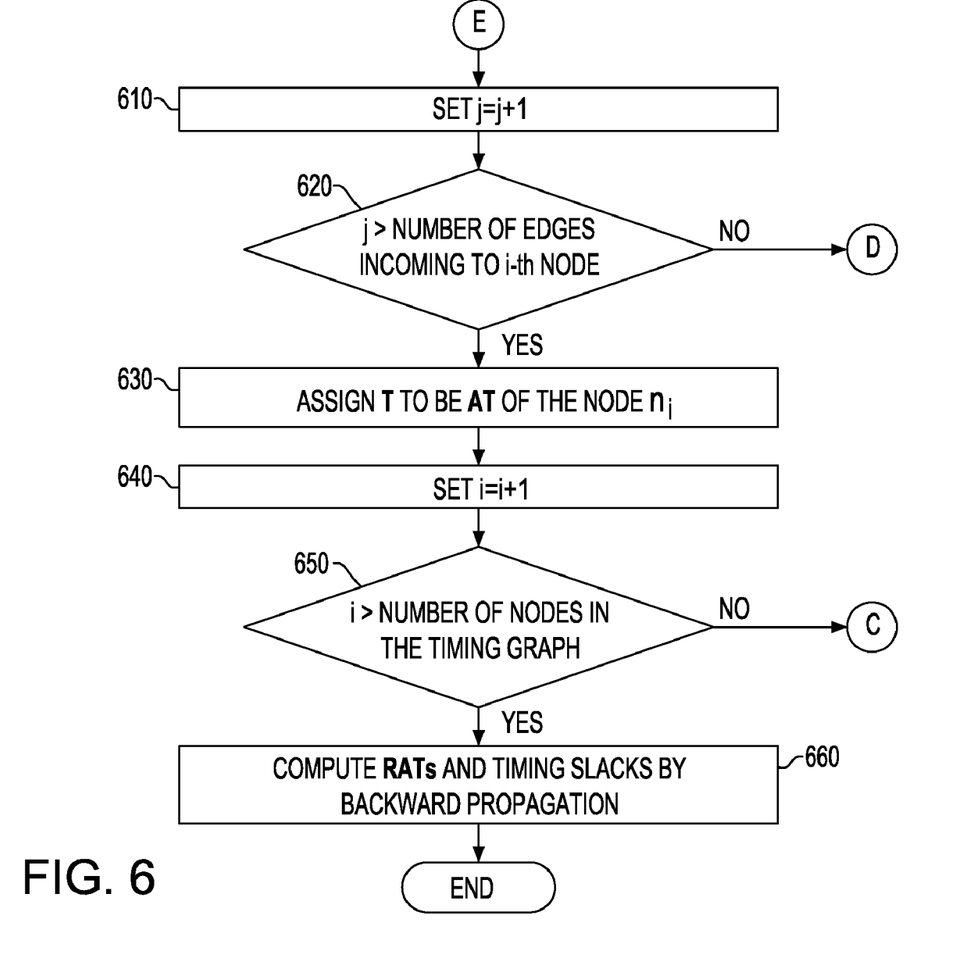

Referring now to FIGS. 5 and 6, there is shown a flow chart illustrating the mixed mode statistical timing analysis.

Block 505 reads the circuit description and constructs its timing graph. It also orders the circuit nodes topologically to ensure that by the time AT at a node is computed, ATs at the sources of the edges incoming to the node have already been calculated.

Block 510 computes the deterministic timing for the timing graph modeling the circuit. It computes deterministic values of ATs, RATs and timing slacks at nodes of the timing graph. In addition, the deterministic values of delays and slews of the signals propagate through the timing edges. All computations are performed for a single combination of variational parameters, usually corresponding to the nominal corner of process and environmental parameters.

Block 515 initializes the counter i of the nodes of the timing graph to prepare to their enumeration.

Block 520 selects the i-th node for calculating its arrival time (AT).

Block 525 initializes the counter of the timing edges incoming to the $i^{th}$ node.

Block 530 initializes temporary variable for accumulating maximum of all arrival times at sinks of the timing edges incoming to the $i^{th}$ node of the timing graph.

Block 535 selects the $j^{th}$ timing edge $e_{i,j}$ incoming to the $i^{th}$ node.

Block 540 determines whether the statistical delay of timing edge $e_{i,j}$ can be approximated by a deterministic value. The check is performed using the results of the deterministic timing determined by block 510, without an actual computation of statistical delay of the current timing edge which can be obtained much faster than the actual computation of the statistical delay. Various criteria can be used for the check, some of which are described hereinafter in detail.

If the statistical delay of timing edge $e_{i,j}$ can be approximated by a deterministic value, then the control is passed to block 545. Otherwise, it branches to block 550.

Block 545 approximates the statistical delay of edge $e_{i,j}$ by the deterministic delay of the edge computed during the deterministic timing performed by block 510. For future statistical computations, the deterministic delay is considered as a statistical delay with the mean equal to the deterministic delay and zero sensitivity to all variational parameters. Block 545 then passes the control to block 555.

Block 550 computes the statistical delay $d_{i,j}$ of selected edge $e_{i,j}$ in the form given by equation EQ 1. Usually, this is done by computing delays of the corresponding digital cell or interconnect for several process corners (combinations of process and environmental parameters), followed by calculating the sensitivities to variational parameters by finite differencing.

Block 555 accumulates statistical maximum of ATs at the sinks of incoming edges $e_{i,j}$ in the variable T. AT $t_{i,j}$ at the source of the timing edge $e_{i,j}$ is incremented by delay $d_{i,j}$ of the edge and combined with a statistical max operation with the previous value of variable T. Details of the statistical max operation are described in U.S. Pat. No. 7,111,260 to Venkateswaran, et al., of common assignee.

Block 610 increments the counter of the timing edges and incoming to the $i^{th}$ node of the timing graph.

Block 620 checks whether all the edges incoming to the $i^{th}$ node are considered. If all the edges have been taken into account, control is then passed to block 630. Otherwise, control branches to block 535.

Block 630 sets arrival time AT at the $i^{th}$ node to be equal to the value computed for variable T.

Block 640 increments the counter of the timing graph nodes.

Block 650 checks whether all the nodes of the timing graph have been considered. If the answer is 'yes', control is passed on to block 660. Otherwise, it branches to Block 525.

Block 660 computes RATs and timing slacks at the nodes of the timing graph by backward propagation. As previously stated, backward propagation is similar to the forward propagation, but the nodes are enumerated in reverse topological order. During the backward propagation, RATs are computed using the edge delays calculated during forward propagation and stored at the data structures describing the nodes of the timing graph.

The present embodiment avoids having to compute and store expensive statistical delays when the deterministic slack is so positive that the variability cannot make the slack negative at a required confidence level, i.e., the variability cannot cause a circuit timing to fail. For instance, if a node of timing graph has a slack of 1 ns at the process corner at which DSTA was performed, then there is no path through the node having a slack worse than 1 ns at the process corner. Assuming that for a given manufacturing process, the variability cannot degrade the deterministic slack by more than 1 ns. Then, the timing point is "safe" for applying deterministic approximation because at the required confidence level the timing point cannot contribute to timing failure anywhere in the circuit. In this case, one can avoid expensive computations of the statistical delay for timing edges incoming to the node of the timing graph. By doing away of the computation and storing of the statistical delay, considerable CPU time and memory can be saved.

Figure 7:
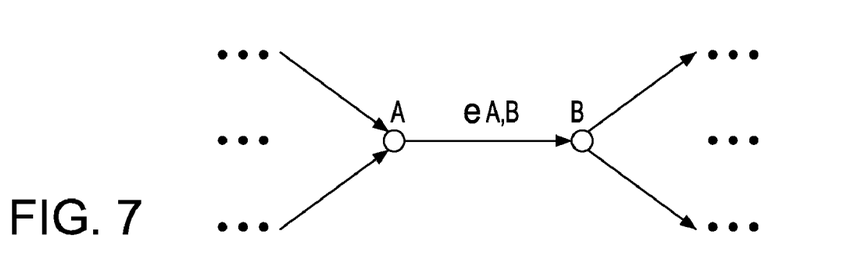
FIG. 7 illustrates an edge slack depicting a fragment of a timing graph with timing edge $e_{A,B}$ extending from node A to node B.

The inventive method can be further customized by introducing the concept of edge slack, as illustrated in FIG. 7 showing a fragment of a timing graph with timing edge $e_{A,B}$ spanning from node A to node B. For late mode timing, the edge slack S for edge $e_{A,B}$ is defined as $$S = RAT(B) - AT(A) - D(e_{A,B}) \quad (EQ2)$$

where RAT(B) is the required arrival time at node B, AT(A) is the arrival time at node A, and $D(e_{A,B})$ is the delay the edge $e_{A,B}$.

Similar to the node slack, the edge slack provides the worst slack among all the paths going through the edge. The concept described above for a node of the timing graph can be extended to an edge that suggests a more precise way to select edges for approximating their statistical delays with deterministic delays. Using edge slack, the approximation can be applied even to some of the edges incoming to a node but not to all of them simultaneously.

A check is performed to determine whether the edge delay can be approximated by its deterministic delay by comparing the slack of the edge with some threshold. When the edge slack is larger than the threshold, it is considered safe to apply a deterministic approximation. The threshold level depends on the operating frequency of the chip. The faster the chip, the shorter the signal propagation paths and hence, less variability is expected.

Referring now to the timing, it is advantageous to use the clock period or the clock cycle then the operation frequency. The clock cycle T is directly related to clock frequency F by the formula T=1/F having the threshold expressed in a fraction of the clock cycle T. The actual value of the fraction is estimated from the variability of delays of digital cells and interconnects. The threshold is not the same for the entire chip because different parts (referenced as clock domains) of the chip may have different clock frequencies.

Figure 8:
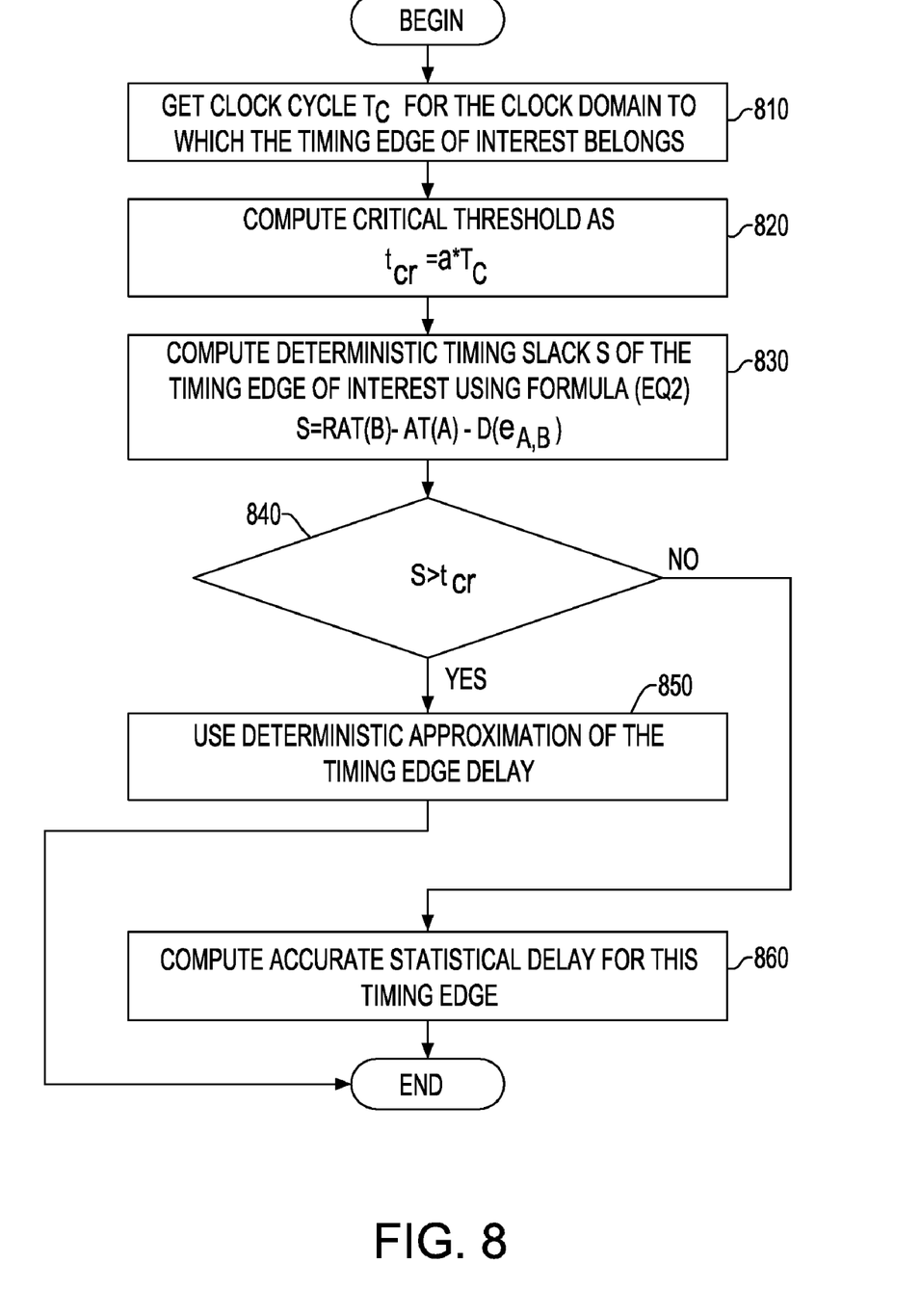
FIG. 8 shows an algorithm that determines whether the statistical delay of a given timing edge can be safely approximated by its deterministic delay.

FIG. 8 shows an algorithm to decide whether the statistical delay of a given timing edge can be safely approximated by its deterministic delay. The algorithm is one possible embodiments of block 540 of the mixed mode timing analysis algorithm shown in FIGS. 5 and 6.

In Block 810, the value of the clock cycle $T_C$ for the clock domain to which the timing edge of interest belongs is determined. The value is a part of timing model of the chip.

Block 820 computes the critical threshold $t_{cr}$ using the formula $t_{cr} = a*T_c$ where a is the maximum possible variability expected in delays of the library cells of the chip. The value can be estimated from the practice of chip design or from libraries of the digital cells.

Block 830 computes the deterministic timing slack S of the timing edge of interest using formula EQ2. Arrival and required arrival times in the formula are deterministic values obtained from the results of the deterministic timing analysis performed by Block 510 of the mixed mode timing analysis.

Block 840 compares the deterministic timing slack S with the critical threshold $t_{cr}$. If $S>t_{cr}$, it is possible to safely approximate the statistical delay of the timing edge by its deterministic value. Therefore, the control is passed to block 850. Otherwise, it is necessary to use an accurate statistical expression of the delay, in which case, the control is passed on to block 860.

Block 850 approximates the statistical delay of the edge by is deterministic delay. In fact, the block just represents Block 545 of the mixed mode timing algorithm, as illustrated in FIGS. 5 and 6.

Block 860 uses the accurate statistical delay for the timing edge. The block represents Block 550 of the mixed mode timing algorithm shown in FIGS. 5 and 6.

Another enhancement to the proposed mixed mode timing methodology is for chips that are in early stages of development, i.e., when many signal propagation paths have large timing failures. In such an instance, many timing slacks can be very negative. For these highly negative timing slacks, it is not relevant to know their accurate values but, instead, it is sufficient to ensure that they are highly negative. In those cases, one can use a low-value threshold for the edge slacks to decide if the statistical delay of timing edges with negative slack can be approximated deterministically.

Figure 9:
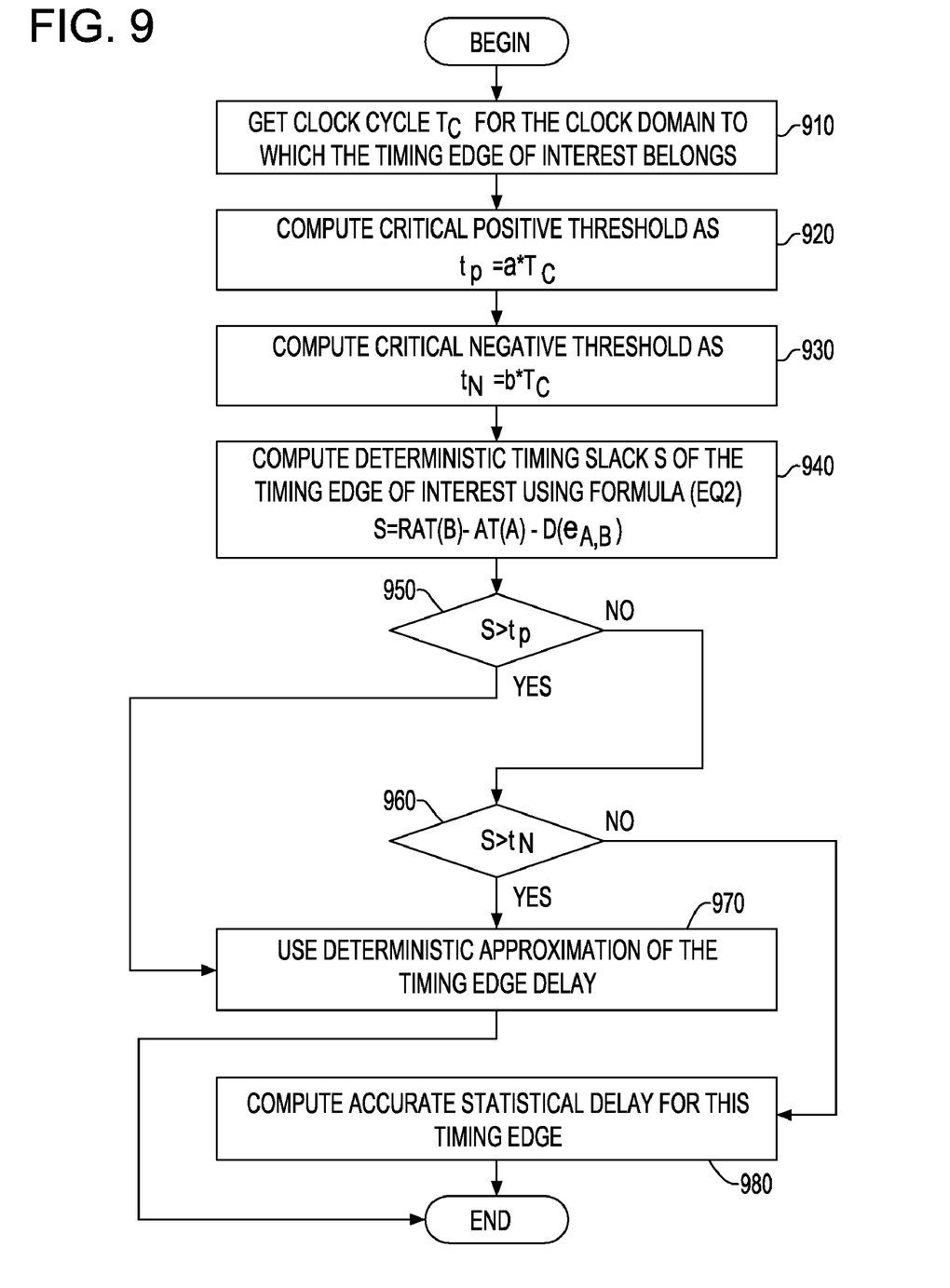
FIG. 9 illustrates an algorithm that incorporates both positive and negative thresholds criteria, in accordance with an embodiment of the invention.

FIG. 9 shows an algorithm incorporating both the positive and negative thresholds criteria.

Block 910 determines the value of the clock cycle $T_C$ for the clock domain which the timing edge of interest belongs to. The value forms part of the chip timing model.

Block 920 computes the critical positive threshold $t_P$. It uses the formula $t_P=a*T_C$ where a is maximum possible positive variability expected in delays of library cells of the chip. The value can be estimated from the practice of chip design or from libraries of the digital cells.

Block 930 computes critical the negative threshold $t_N$, using the formula $t_N=b*T_C$ where b is the maximum possible negative variability expected in delays of library cells of the chip. This value can be estimated from the practice of chip design or from libraries of the digital cells. Using different values of positive and negative delay variability are allowed. This can be useful for handling asymmetric variations or when one wishes to have different confidence level for positive and negative variations.

Block 940 computes the deterministic timing slack S of the timing edge of interest using equation EQ2, wherein the arrival and required arrival times are deterministic values obtained from the results of the deterministic timing analysis performed by block 510 of the mixed mode timing analysis.

Block 950 compares the deterministic timing slack S and the positive threshold $t_P$. If $S>t_P$, it is possible to safely approximate statistical delay of the timing edge by its deterministic value. Therefore, the control is passed to block 970. Otherwise, the control is passed to block 960.

Block 960 compares the deterministic timing slack S and the negative threshold $t_N$. If $S<t_N$ it is possible to safely approximate statistical delay of the timing edge by its deterministic value. Therefore, the control is passed to block 970. Otherwise, it is necessary to use an accurate statistical expression of the delay of the timing edge. Hence, the control is passed to block 960.

Block 970 approximates the statistical delay of edge by the deterministic delay of the edge. In fact the block just represents the Block 545 of the mixed mode algorithm, shown in FIGS. 5 and 6.

Block 980 uses an accurate statistical delay for the timing edge. The block represents Block 550 of the mixed mode algorithm shown in FIGS. 5 and 6.

One of ordinary skill in the art will readily appreciate that different criteria can decide whether to use deterministic or statistical delay of a timing edge to achieve various degrees of accuracy, and/or CPU time and memory tradeoffs. Other examples of decision criteria include:

completely filtering data paths and applying a filter to clock paths; adding a user-defined assertion to always analyze specific paths; and adding a user-defined assertion to always skip specific paths.

The present invention demonstrates a methodology wherein one can perform selective statistical and deterministic timing analyses. By employing several decision techniques, one can avoid memory/CPU intensive statistical delay analysis by using approximate delays for paths that do not impact the final timing evaluation, thus maintaining process coverage benefits of statistical analysis, and by using approximate delays along those paths whose timing constrains are failing with a sufficiently poor slack even at a selected deterministic process corner.

Finally, the present invention can be realized in hardware, software, or a combination of hardware and software. The present invention can be realized in a centralized fashion in one computer system or in a distributed fashion where different elements are spread across several interconnected computer systems. Any kind of computer system—or other apparatus adapted for carrying out the methods described herein—is suitable. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which—when loaded in a computer system—is able to carry out these methods.

Computer program means or computer program in the present context mean any expression, in any language, code or notation, of a set of instructions intended to cause a system having an information processing capability to perform a particular function either directly or after conversion to another language, code or notation and/or reproduction in a different material form.

While the present invention has been particularly described in conjunction with exemplary embodiments, it is evident that many alternatives, modifications and variations will be apparent to those skilled in the art in light of the present description. It is therefore contemplated that the appended claims will embrace any such alternatives, modifications and variations as falling within the true scope and spirit of the present invention.

What is claimed is:

1. A method for statistically analyzing the timing performance of an integrated circuit (IC) chip design given a predetermined slack filtering criterion, the method comprising:
   a) using a computer, performing a deterministic static timing analysis of said IC chip design to obtain deterministic values of timing parameters of said IC chip design;

b) computing a deterministic edge or node slack for each timing edge or node of said IC chip design from said deterministic values of said timing parameters;

c) approximating the deterministic value of at least one timing parameter to its statistical representation if said deterministic edge or node slack meets said filtering criterion; otherwise, computing an actual statistical representation of the at least one timing parameter; and d) conducting the statistical analysis of the timing performance of the IC chip design by propagating mixed-mode deterministic and said actual statistical timing parameters throughout said IC chip design, e) wherein said slack filtering criterion is determined by edge or a node slack of timing edge or a node compared to a predetermined lower threshold value.

2. The method as recited in claim 1 wherein said timing parameters are selected from a group consisting of delays, slew timings, ATs, RATS, and any combination thereof.

3. The method as recited in claim 1 wherein at least one of said timing parameters is computed statistically, and at least one of said timing parameters is computed as a deterministic approximation of said statistical value.

4. The method as recited in claim 1 wherein said slack filtering criterion is determined by edge or a node slack of timing edge or node compared to a predetermined upper threshold value.

5. The method as recited in claim 1 wherein said predetermined lower threshold value is computed as a fraction of a clock cycle.

6. The method as recited in claim 4 wherein said predetermined upper threshold value is computed as a fraction of a clock cycle.

7. The method as recited in claim 1 wherein said slack filtering criterion is determined based on whether the timing edge, node, gate or wire belongs to a clock net.

8. The method as recited in claim 1 wherein said slack filtering criterion is determined based on whether the timing edge, node, gate or wire belongs to a data net.

9. The method as recited in claim 1 wherein said mixed mode deterministic and statistical timing analyses are performed on a subset of said IC chip design.

10. The method as recited in claim 1 wherein said mixed mode deterministic and statistical timing analyses are performed on a predetermined subset of said timing parameters.

11. The method as recited in claim 1 further comprising storing in statistical form a subset of said timing parameters or storing others of said timing parameters in a deterministic approximation of its statistical value.

12. The method as recited in claim 11 wherein said deterministic timing slack of timing edge or node is compared to a lower threshold to determine whether to store a statistical form of said timing parameters or to store said deterministic approximation of its statistical value.

13. The method as recited in claim 11 wherein said deterministic timing slack of timing edge or node is compared to an upper threshold to determine whether to store a statistical form of said timing parameter or to store said deterministic approximation of its statistical value.

14. The method as recited in claim 11 wherein the criterion for storing deterministic approximation of a statistical timing parameter is determined based on whether the timing edge, node, gate or wire belongs to a clock net.

15. The method as recited in claim 11 wherein the criterion for storing deterministic approximation of statistical timing parameter is determined based on whether the timing edge, node, gate or wire belongs to a data net.

16. The method as recited in claim 11 wherein said statistical timing analysis specifies timing edges, nodes, gates or wires for which deterministic approximations of timing parameter are stored instead of said statistical value.

17. A non-transitory program storage device readable by a machine, tangibly embodying a program of instructions executable by the machine to perform method steps for statistically analyzing the timing performance of an integrated circuit (IC) chip design, the method comprising:

a) using a computer, performing a deterministic static timing analysis of said IC chip design to obtain deterministic values of timing parameters of said IC chip design;

b) determining a deterministic edge or node slack for each timing edge or node of said IC chip design from said deterministic values of said timing parameters;

c) approximating the deterministic value of at least one timing parameter to its statistical representation if the deterministic edge or node slack meets the filtering criterion; else, computing an actual statistical representation of said at least one timing parameter; and d) conducting the statistical analysis of the timing performance of the IC chip design by propagating mixed-mode deterministic and said actual statistical timing parameters throughout the IC chip design, e) wherein said slack filtering criterion is determined by edge or a node slack of timing edge or a node compared to a predetermined lower threshold value.

* * * * *